United States Patent
Yu et al.

[19]

[11] Patent Number: 6,110,780
[45] Date of Patent: Aug. 29, 2000

[54] USING NO OR N$_2$O TREATMENT TO GENERATE DIFFERENT OXIDE THICKNESSES IN ONE OXIDATION STEP FOR SINGLE POLY NON-VOLATILE MEMORY

[75] Inventors: Mo-Chiun Yu, Taipei; Wen-Ting Chu, Kaoushiung County; Syun-Min Jang, Hsin-Chu, all of Taiwan

[73] Assignee: Taiwan Semiconductor Manufacturing Company, Hsin-Chu, Taiwan

[21] Appl. No.: 09/283,842

[22] Filed: Apr. 1, 1999

[51] Int. Cl.$^7$ ............................................... H01L 21/8247
[52] U.S. Cl. ........................... 438/258; 438/264; 438/981
[58] Field of Search ...................... 438/257–267

[56] References Cited

U.S. PATENT DOCUMENTS

| | | | |
|---|---|---|---|
| 5,254,489 | 10/1993 | Nakata . | |
| 5,480,828 | 1/1996 | Hsuet al. ................................... | 437/56 |
| 5,498,577 | 3/1996 | Fulford, Jr. et al. ..................... | 437/228 |
| 5,502,009 | 3/1996 | Lin ........................................ | 437/239 |
| 5,591,681 | 1/1997 | Wristers et al. ......................... | 437/240 |
| 5,600,164 | 2/1997 | Ajika et al. .............................. | 257/321 |
| 5,668,035 | 9/1997 | Fang et al. .............................. | 438/239 |
| 5,834,351 | 11/1998 | Chang et al. ............................ | 438/266 |
| 5,926,729 | 7/1999 | Tsai et al. ................................ | 438/591 |
| 5,942,780 | 8/1999 | Barsan et al. ........................... | 257/321 |
| 6,037,224 | 3/2000 | Buller et al. ............................. | 438/258 |

*Primary Examiner*—Richard Booth
*Attorney, Agent, or Firm*—George O. Saile; Stephen B. Ackerman; Rosemary L. S. Pike

[57] ABSTRACT

A new method of using a NO or N$_2$O treatment on a first area on a wafer in order to form a thinner oxide film in the first area and a thicker oxide film in a second area on a wafer using a single oxidation step is achieved. A semiconductor substrate of a silicon wafer is provided wherein a first area is separated from a second area by an isolation region. The silicon substrate in the second area is treated with NO or N$_2$O whereby a high-nitrogen silicon oxide layer is formed on the surface of semiconductor substrate in the second area. A tunnel window is defined in the first area and the oxide layer within the tunnel window is removed. The silicon wafer is oxidized whereby a tunnel oxide layer forms within the tunnel window and whereby a gate oxide layer is formed overlying the high-nitrogen silicon oxide layer in the second area. The tunnel oxide layer has a greater thickness than the combined thickness of the gate oxide layer and the high-nitrogen silicon oxide layer. A conducting layer is deposited and patterned overlying the tunnel oxide layer and the gate oxide layer and fabrication of the integrated circuit device is completed.

27 Claims, 3 Drawing Sheets

USING NO OR N₂O TREATMENT TO GENERATE DIFFERENT OXIDE THICKNESSES IN ONE OXIDATION STEP FOR SINGLE POLY NON-VOLATILE MEMORY

BACKGROUND OF THE INVENTION (1) Field of the Invention

The invention relates to a method of fabricating embedded memory devices, and more particularly, to a method of fabricating embedded memory devices in which one oxidation step can provide a thicker tunnel oxide and a thinner periphery transistor oxide simultaneously in the fabrication of integrated circuits.

(2) Description of the Prior Art

In the deep sub-micron process of single-poly non-volatile memory, the oxide thickness of the periphery transistors must be smaller than that of the tunnel oxide. In a conventional process, a second oxidation is performed to thicken the tunnel oxide. This composite tunnel oxide degrades the quality of the tunnel oxide. In another conventional process, a gate oxide is grown, then removed in one area. A second area is shielded by photoresist while the first area is reoxidized. Removal of the photoresist mask may cause pollution and degradation of the oxide film.

U.S. Pat. No. 5,600,164 to Ajika et al shows a memory device having three different gate oxide thicknesses, but does not describe a method for producing the differing thicknesses. U.S. Pat. Nos. 5,498,577 to Fulford, Jr. et al and 5,591,681 to Wristers et al teach methods involving two oxidation steps in which a portion of the first oxide is removed and then the second oxidation forms a second thinner oxide and thickens the first oxide film. U.S. Pat. No. 5,502,009 to Lin teaches a method in which a portion of the first oxide is removed and regrown as a thicker oxide layer. A silicon nitride shield over the non-removed first oxide film prevents further growth of the first film. U.S. Pat. No. 5,668,035 to Fang et al teaches a similar method to Lin in which a thinner second oxide layer is regrown while the first oxide film is shielded from oxidation by a polysilicon layer. U.S. Pat. No. 5,480,828 to Hsu et al discloses a method of implanting nitrogen ions into a portion of a silicon substrate. The presence of the nitrogen ions slows the oxidation rate over that area of the substrate resulting in a thinner gate oxide film in that area using one oxidation step. However, the nitrogen implantation is not a good idea for tunnel oxide because the implant will damage the substrate.

SUMMARY OF THE INVENTION

A principal object of the present invention is to provide an effective and very manufacturable method of forming a thicker oxide film in a first area on a wafer and a thinner oxide film in a second area on a wafer using a single oxidation step in the fabrication of an integrated circuit.

Another object of the present invention is to provide an effective and very manufacturable method of forming a thicker tunnel oxide in a memory portion of an integrated circuit device and a thinner transistor oxide in a periphery portion of an integrated circuit device using a single oxidation step.

A further object of the invention is to prevent photoresist damage to the tunnel oxide when forming transistor oxide films in the periphery of a memory circuit.

Yet another object is to use a NO or N₂O treatment on the periphery transistor area in order to form a thinner transistor oxide and a thicker tunnel oxide in a single oxidation step.

Yet another object is to use a NO or N₂O treatment on a first area on a wafer in order to form a thinner oxide film in the first area and a thicker oxide film in a second area on a wafer using a single oxidation step.

In accordance with the objects of this invention a new method of using a NO or N₂O treatment on a first area on a wafer in order to form a thinner oxide film in the first area and a thicker oxide film in a second area on a wafer using a single oxidation step is achieved. A semiconductor substrate of a silicon wafer is provided wherein a first area is separated from a second area by an isolation region. The silicon substrate in the second area is treated with NO or N₂O whereby a high-nitrogen silicon oxide layer is formed on the surface of semiconductor substrate in the second area. A tunnel window is defined in the first area and the oxide layer within the tunnel window is removed. The silicon wafer is oxidized whereby a tunnel oxide layer forms within the tunnel window and whereby a gate oxide layer is formed overlying the high-nitrogen silicon oxide layer in the second area. The tunnel oxide layer has a greater thickness than the combined thickness of the gate oxide layer and the high-nitrogen silicon oxide layer. A conducting layer is deposited and patterned overlying the tunnel oxide layer and the gate oxide layer and fabrication of the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

The invention will be described with reference to FIGS. 1–6 which illustrate a single-poly non-volatile memory device. It will be understood by those skilled in the art that the process of the invention can be used in any application in which it is desired to use a single oxidation step to grow oxides of differing thicknesses.

Figure 1:
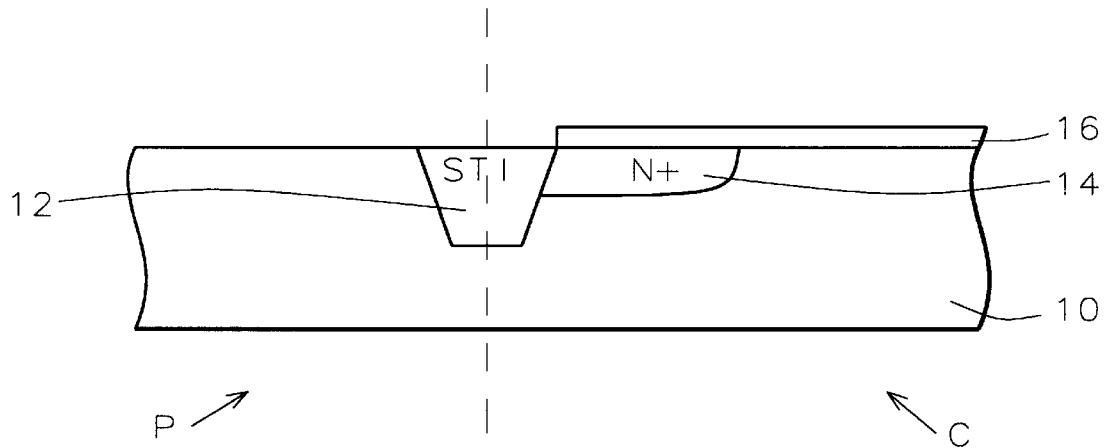
FIGS. 1 through 5 schematically illustrate in cross-sectional representation a preferred embodiment of the present invention.
Figure 2:
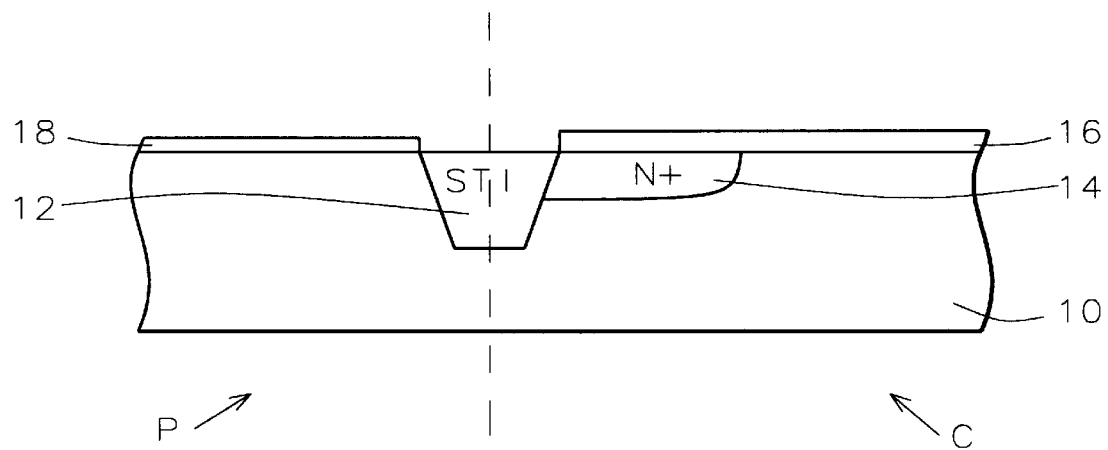

Referring now more particularly to FIG. 1, there is illustrated a portion of a partially completed integrated circuit. There is shown a semiconductor substrate 10, preferably composed of monocrystalline silicon. Isolation regions are formed to separate active areas from one another. For example, shallow trench isolation (STI) region 12 is shown separating the cell area C from the periphery area P. Other isolation schemes such as local oxidation of silicon (LOCOS) may alternately be used. For illustration purposes, the portion of the wafer shown is divided by the dashed line into a memory cell portion C and a periphery portion P. Ions are implanted to form N+ area 14 which will be the tunneling window. The N+ ions can increase the electrical field to facilitate electron tunneling.

A first oxidation is performed, resulting in oxide layer 16, which is then removed in the periphery area P. This oxide layer 16 in the cell area C will shield the substrate from the NO or N₂O treatment step.

The wafer is subjected to a NO or N₂O treatment. This may be a furnace treatment or a rapid thermal process (RTP), for example at a temperature of 900 to 950° C. for 20 to 60 seconds. This treatment results in the formation of a nitrogen-containing silicon oxide film 18, shown in FIG. 2. The oxide film 18 has a thickness of between about 10 to 30 Angstroms. The film 18 contains a high concentration of nitrogen, but not high enough to be called an silicon oxynitride film.

Figure 3:
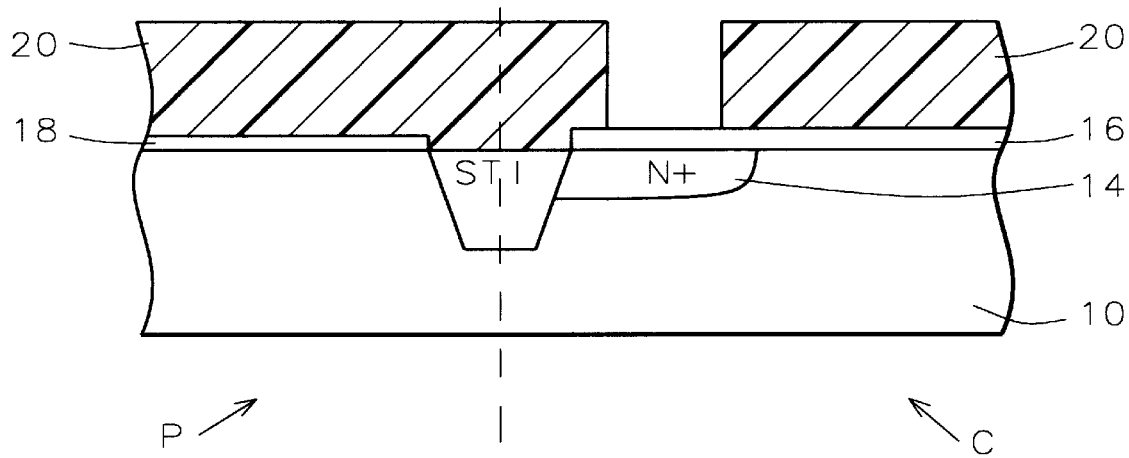

A layer of photoresist 20 is coated over the wafer and patterned to define a tunneling window, as illustrated in FIG. 3. The oxide film within the tunneling window is removed, typically by an oxide dip.

Figure 4:
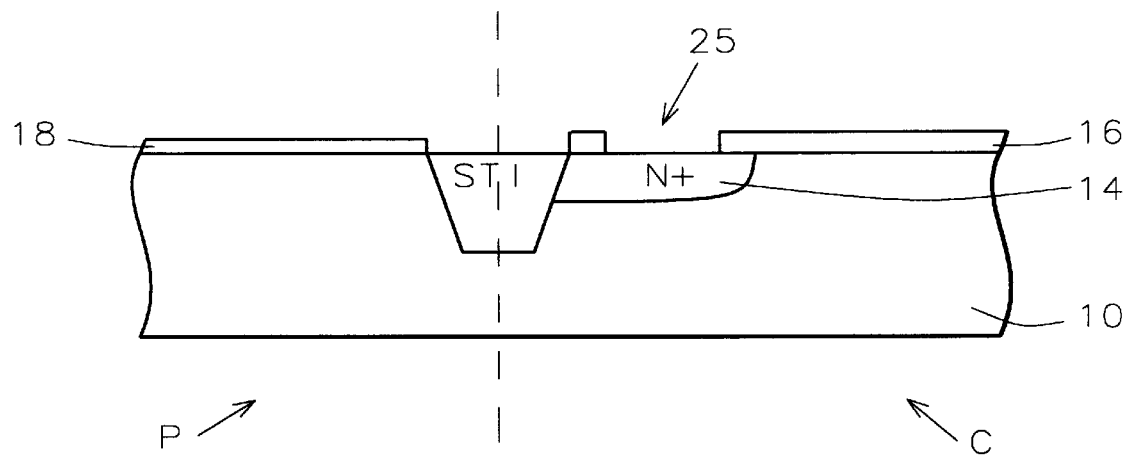
Figure 5:
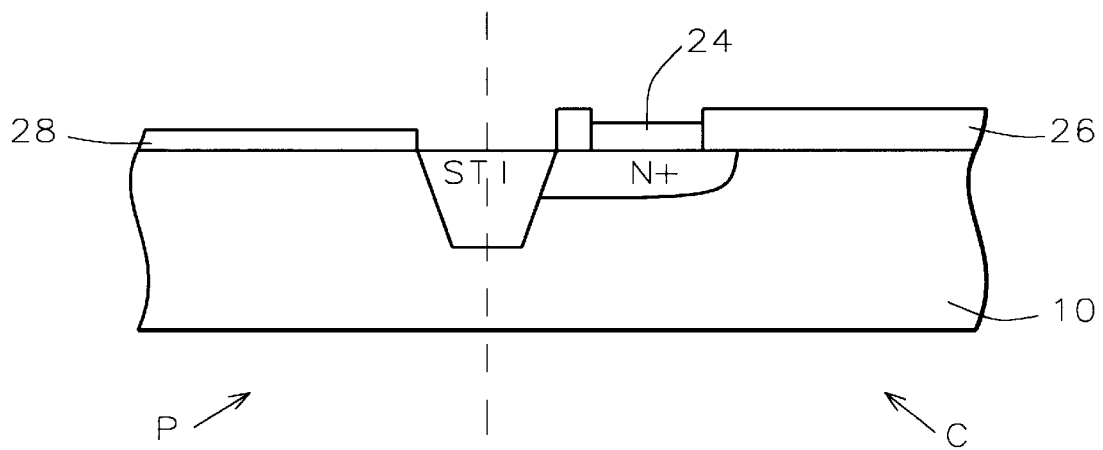

Referring now to FIG. 4, the photoresist mask is removed. Tunneling window 25 is shown.

Now, the wafer is oxidized using a conventional furnace thermal oxidation process. Tunnel oxide 24 grows within the tunnel window to a thickness of between about 70 and 150 Angstroms. The oxide film 16 increases in thickness to a thickness 26 of between about 180 and 500 Angstroms. The high nitrogen silicon oxide film 18 within the periphery area is also oxidized. However, because of the presence of nitrogen within the film 18, the oxidation rate is depressed resulting in a thinner gate oxide layer 28 in the periphery area P. The combined oxide film 28 in the periphery area has a thickness of between about 20 and 70 Angstroms.

Because of the NO or $N_2O$ treatment in the periphery area, the single oxidation step produces a thinner oxide thickness in the periphery area and a thicker tunnel oxide thickness in the cell area.

The tunnel oxide 24 is not a composite layer which would degrade its quality. No shielding layer is used over the tunnel oxide or the peripheral oxide which also would degrade quality.

Figure 6:
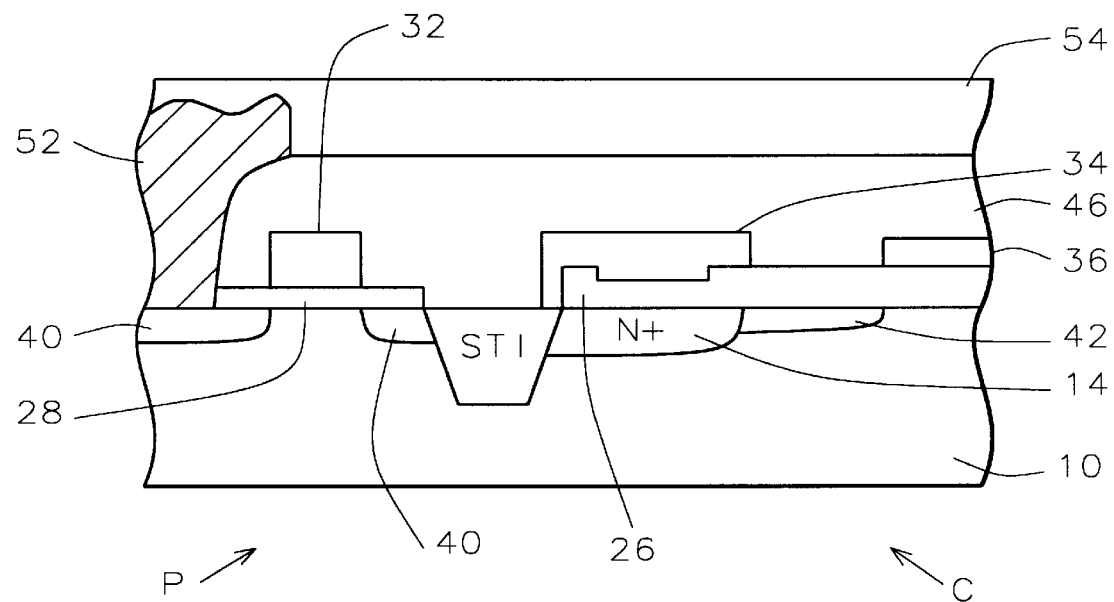
FIG. 6 schematically illustrates in cross-sectional representation a completed integrated circuit of the present invention.

Processing continues as is conventional in the art. For example, the integrated circuit of the present invention may be completed as shown in FIG. 6 by depositing polysilicon or amorphous silicon and patterning to form the gate pattern as shown. A gate electrode 32 is shown in the periphery area P. A floating gate 34 and select transistor gate electrode 36 are shown in the cell area C. Source and drain regions 40 and 42 are formed within the semiconductor substrate and associated with the gate electrodes 32 and 36, respectively. A dielectric layer composed of, for example, borophosphosilicate glass (BPSG) and or silicon dioxide 46 covers the semiconductor device structures. Openings are made through the dielectric layer 46 to the source and drain regions 40 within the semiconductor substrate where contacts are desired. A metal layer 52, typically aluminum, is deposited to fill the contact openings and patterned. A passivation layer 54 completes fabrication of the integrated circuit.

The process of the present invention provides a very manufacturable method of providing thermal oxide films of differing thicknesses as a result of an NO or $N_2O$ thermal treatment prior to oxidation. The resulting oxide films have high quality because they are not composite films and because photoresist pollution has been avoided. The process of the invention is especially useful in memory devices where the transistor oxide thickness in the periphery area is smaller than the tunnel oxide thickness in the memory cell area. However, the process of the invention may be used in any application in which quality oxide films of differing thicknesses are desired.

EXAMPLE

The following example is given to show the important features of the invention and to aid in the understanding thereof. Variations may be made by one skilled in the art without departing from the spirit and scope of the invention.

The process of the invention has been implemented and tested on a control wafer. First, the rapid thermal process (RTP) of the invention was performed to form the nitrogen-containing silicon oxide layer (18 in FIG. 4). The RTP was performed at 900° C. for durations from 20 to 60 seconds, as shown in Table 1. Next, the tunneling window was opened and the furnace thermal oxidation was performed. Thicknesses in Angstroms of the first oxide layer in the periphery area (P), the resulting oxide layer 28 in the periphery area (P) and the tunnel oxide layer 26 in the cell area (C) are shown in Table 1.

TABLE 1

| RTP(sec) | 1st oxide(P) | final oxide(P) | tunnel oxide(C) |
|---|---|---|---|
| 20 | 16.2775 | 57.745 | 95.207 |
| 30 | 17.2163 | 49.756 | 95.207 |
| 40 | 17.9079 | 44.618 | 95.207 |
| 60 | 18.7211 | 39.102 | 95.207 |

Table 1 shows the experimental data for the process of the invention using NO treatment. $N_2O$ data ware similar, but slightly poorer. Both treatment options are acceptable, but NO is preferred.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device having a first region and a second region on a silicon wafer comprising:

providing said first region of a semiconductor substrate of said silicon wafer separated from said second region of said semiconductor substrate by an isolation region;

growing an oxide layer overlying said semiconductor substrate in said first region;

treating said semiconductor substrate in said second region with one of the group containing NO and $N_2O$ whereby a high-nitrogen silicon oxide layer is formed on the surface of said semiconductor substrate in said second region;

defining a tunnel window in said first region and removing said oxide layer within said tunnel window;

oxidizing said silicon wafer whereby said oxide layer increases in thickness and whereby a tunnel oxide layer forms within said tunnel window wherein said tunnel oxide has a first thickness and whereby a gate oxide layer is formed overlying said high-nitrogen silicon oxide layer in said second region and wherein said gate oxide layer and said high-nitrogen silicon oxide layer have a combined second thickness and wherein said first thickness is greater than said second thickness;

depositing and patterning a conducting layer overlying said oxide layer, said tunnel oxide layer and said gate oxide layer; and completing fabrication of said integrated circuit device.

2. The method according to claim 1 wherein said first region comprises a memory cell region of said integrated circuit device.

3. The method according to claim 1 wherein said second region comprises a periphery transistor region of said integrated circuit device.

4. The method according to claim 1 wherein said first oxide layer has a thickness of between about 100 and 500 Angstroms.

5. The method according to claim 1 wherein said step of treating said semiconductor substrate in said second region with one of the group containing NO and $N_2O$ is performed in a furnace at a temperature of between about 900 and 1000° C. for 10 to 60 minutes.

6. The method according to claim 1 wherein said step of treating said semiconductor substrate in said second region with one of the group containing NO and $N_2O$ is performed in a rapid thermal process at a temperature of between about 850 and 1100° C. for 10 to 100 seconds.

7. The method according to claim 1 wherein said high-nitrogen silicon oxide film has a thickness of between about 10 and 30 Angstroms.

8. The method according to claim 1 wherein said step of defining said tunnel window comprises photolithography techniques using a photoresist mask and wherein said photoresist mask is removed before said step of oxidizing said silicon wafer.

9. The method according to claim 1 wherein said first thickness is between about 70 and 150 Angstroms.

10. The method according to claim 1 wherein said second thickness is between about 20 and 70 Angstroms.

11. The method according to claim 1 wherein said conducting layer comprises polysilicon.

12. The method according to claim 1 wherein said conducting layer comprises amorphous silicon.

13. A method of fabricating a single-poly non-volatile memory integrated circuit device on a silicon wafer comprising:

providing a memory region of a semiconductor substrate of said silicon wafer separated from a periphery region of said semiconductor substrate by an isolation region;

growing an oxide layer overlying said semiconductor substrate;

removing said oxide layer in said periphery region;

treating said semiconductor substrate in said periphery region with one of the group containing NO and $N_2O$ whereby a high-nitrogen silicon oxide layer is formed on the surface of said semiconductor substrate in said periphery region;

defining a tunnel window in said memory region and removing said oxide layer within said tunnel window;

oxidizing said silicon wafer whereby said oxide layer increases in thickness and whereby a tunnel oxide layer forms within said tunnel window wherein said tunnel oxide has a first thickness and whereby a gate oxide layer is formed overlying said high-nitrogen silicon oxide layer in said periphery region and wherein said gate oxide layer and said high-nitrogen silicon oxide layer have a combined second thickness and wherein said first thickness is greater than said second thickness;

depositing a conducting layer overlying said oxide layer, said tunnel oxide layer and said gate oxide layer;

patterning said conducting layer to form a gate electrode in said periphery region and to form a floating gate overlying said tunnel oxide in said memory region; and completing fabrication of said integrated circuit device.

14. The method according to claim 13 wherein said first oxide layer has a thickness of between about 100 and 500 Angstroms.

15. The method according to claim 13 wherein said step of treating said semiconductor substrate in said periphery region with one of the group containing NO and $N_2O$ is performed in a furnace at a temperature of between about 900 and 1000° C. for 10 to 60 minutes.

16. The method according to claim 13 wherein said step of treating said semiconductor substrate in said periphery region with one of the group containing NO and $N_2O$ is performed in a rapid thermal process at a temperature of between about 850 and 1100° C. for 10 to 100 seconds.

17. The method according to claim 13 wherein said high-nitrogen silicon oxide film has a thickness of between about 10 and 30 Angstroms.

18. The method according to claim 13 wherein said step of defining said tunnel window comprises photolithography techniques using a photoresist mask and wherein said photoresist mask is removed before said step of oxidizing said silicon wafer.

19. The method according to claim 13 wherein said first thickness is between about 70 and 150 Angstroms.

20. The method according to claim 15 wherein said second thickness is between about 20 and 70 Angstroms.

21. A method of fabricating a single-poly non-volatile memory integrated circuit device on a silicon wafer comprising:

providing a memory region of a semiconductor substrate of said silicon wafer separated from a periphery region of said semiconductor substrate by an isolation region;

growing an oxide layer overlying said semiconductor substrate;

removing said oxide layer in said periphery region;

treating said semiconductor substrate in said periphery region with NO whereby a high-nitrogen silicon oxide layer is formed on the surface of said semiconductor substrate in said periphery region;

defining a tunnel window in said memory region and removing said oxide layer within said tunnel window;

oxidizing said silicon wafer whereby said oxide layer increases in thickness and whereby a tunnel oxide layer forms within said tunnel window wherein said tunnel oxide has a first thickness and whereby a gate oxide layer is formed overlying said high-nitrogen silicon oxide layer in said periphery region and wherein said gate oxide layer and said silicon oxynitride layer have a combined second thickness and wherein said first thickness is greater than said second thickness;

depositing a polysilicon layer overlying said oxide layer, said tunnel oxide layer and said gate oxide layer;

patterning said polysilicon layer to form a gate electrode in said periphery region and to form a floating gate overlying said tunnel oxide in said cell region; and completing fabrication of said integrated circuit device.

22. The method according to claim 21 wherein said step of treating said semiconductor substrate in said periphery region with NO is performed in a furnace at a temperature of between about 900 and 1000° C. for 10 to 60 minutes.

23. The method according to claim 21 wherein said step of treating said semiconductor substrate in said periphery region with NO is performed in a rapid thermal process at a temperature of between about 850 and 1100° C. for 10 to 100 seconds.

24. The method according to claim 21 wherein said high-nitrogen silicon oxide film has a thickness of between about 10 and 30 Angstroms.

25. The method according to claim 21 wherein said step of defining said tunnel window comprises photolithography techniques using a photoresist mask and wherein said photoresist mask is removed before said step of oxidizing said silicon wafer.

26. The method according to claim 21 wherein said first thickness is between about 70 and 150 Angstroms.

27. The method according to claim 21 wherein said second thickness is between about 20 and 70 Angstroms.

* * * * *